US010658434B2

(12) United States Patent
Song et al.

(10) Patent No.: US 10,658,434 B2
(45) Date of Patent: May 19, 2020

(54) DISPLAY DEVICE WITH AN INTEGRATED TOUCH SENSOR UTILIZING BRIDGE STRUCTURES

(71) Applicant: LG Display Co., Ltd., Seoul (KR)

(72) Inventors: Tae-Joon Song, Paju-si (KR); Kyu-Hwang Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/712,711

(22) Filed: Sep. 22, 2017

(65) Prior Publication Data

US 2018/0175116 A1    Jun. 21, 2018

(30) Foreign Application Priority Data

Dec. 16, 2016  (KR) .................. 10-2016-0172664

(51) Int. Cl.
*H01L 27/32* (2006.01)
*H01L 51/52* (2006.01)
*H01L 51/56* (2006.01)
*G06F 3/041* (2006.01)

(52) U.S. Cl.
CPC .......... *H01L 27/323* (2013.01); *G06F 3/0412* (2013.01); *H01L 51/5203* (2013.01); *H01L 51/56* (2013.01); *G06F 2203/04103* (2013.01)

(58) Field of Classification Search
CPC ................... G06F 3/044; G06F 3/0412; G06F 2203/04103; H01L 27/323; H01L 51/56; H01L 51/5203
See application file for complete search history.

(56) References Cited

U.S. PATENT DOCUMENTS

| 2010/0035030 | A1* | 2/2010 | Huang .................. | C23C 14/086 428/201 |
| 2014/0079927 | A1* | 3/2014 | Yoshioka .............. | C23C 14/086 428/213 |
| 2015/0001060 | A1* | 1/2015 | Kim ........................ | G06F 3/044 200/600 |
| 2016/0092015 | A1* | 3/2016 | Al-Dahle ................ | G06F 3/044 345/174 |
| 2016/0154499 | A1* | 6/2016 | Bae ......................... | G06F 3/044 345/174 |
| 2016/0357303 | A1* | 12/2016 | Xie ......................... | G06F 3/0412 |
| 2018/0095570 | A1* | 4/2018 | Hong ...................... | G06F 3/0412 |
| 2018/0095571 | A1* | 4/2018 | Park ........................ | G06F 3/0412 |
| 2018/0120999 | A1* | 5/2018 | Cheng ..................... | H01L 27/322 |

* cited by examiner

*Primary Examiner* — Ryan A Lubit
(74) *Attorney, Agent, or Firm* — Seed IP Law Group LLP

(57) ABSTRACT

An organic light-emitting display device and a method of manufacturing the same are disclosed. The organic light-emitting display device includes a touch sensor having a plurality of touch electrodes on an encapsulation stack covering a light-emitting element. The touch electrodes are formed at a low temperature and are crystallized through an annealing process, whereby it is possible to prevent damage to an organic light-emitting layer at the time of forming the touch electrodes. Thus the touch electrodes can be formed on the encapsulation stack without an additional bonding process to bond the touch sensor to the organic light-emitting display device.

21 Claims, 18 Drawing Sheets

DISPLAY DEVICE WITH AN INTEGRATED TOUCH SENSOR UTILIZING BRIDGE STRUCTURES

This application claims the benefit of Korean Patent Application No. 10-2016-0172664, filed on Dec. 16, 2016, which is hereby incorporated by reference as if fully set forth herein.

BACKGROUND

Technical Field

The present disclosure relates to a display device and a method of manufacturing the same, and more particularly, to a display device with an integrated touch sensor formed on an encapsulation stack of the display device.

Description of the Related Art

A touchscreen is an input device that allows a user to input a command by selecting one of multiple instructions displayed on a screen, such as a display device, using a user's hand or an object. That is, the touchscreen converts a contact position at which the user's hand or the object directly contacts the touchscreen into an electrical signal to receive the instruction selected at the contact position as an input signal. The touchscreen has come to be increasingly used, since the touchscreen is capable of replacing an additional input device that is connected to the display device for operation, such as a keyboard or a mouse.

The touchscreen is attached to the front of a display panel, such as a liquid crystal display panel or an organic electroluminescent display panel, using an adhesive. Separately manufacturing and then attaching the touchscreen to the front of the display panel using adhesive is complicated and costly.

BRIEF SUMMARY

The present disclosure is directed to a display device and a method of manufacturing the same that allows for a touch sensor to be formed on a display device that would otherwise be prohibitively sensitive to environmental conditions associated with manufacturing a touch display. For instance, the stack of layers for a touch sensor can be applied and etched using lower temperature processes than are known in the art. The reduction in damaging environmental conditions can be provided by the specific structures protecting the underlying layers due to their position and dimensions, as well as by the specific material properties for the various selected layers.

Some embodiments provide a display device manufactured through a simplified process at reduced costs and a method of manufacturing the same.

Additional advantages, objects, and features of the embodiments will be set forth in part in the description which follows and in part will become apparent to those having ordinary skill in the art upon examination of the following or may be learned from practice of the various embodiments. The objectives and other advantages of the various embodiments may be realized and attained by the structure particularly pointed out in the written description and claims hereof as well as the appended drawings.

Some embodiments include an organic light-emitting display device having a touch sensor includes a plurality of touch electrodes on an encapsulation stack so as to cover a light-emitting element, wherein the touch electrodes are deposited at a low temperature (between room temperature and 100° C.) and are crystallized through an annealing process, whereby it is possible to prevent damage to an organic light-emitting layer at the time of forming the touch electrodes. The touch electrodes are disposed on the encapsulation stack, with the result that an additional bonding process is not required, whereby the process is simplified and costs are reduced.

It is to be understood that both the foregoing general description and the following detailed description of the various embodiments are exemplary and explanatory and are intended to provide further explanation of the embodiments as claimed.

BRIEF DESCRIPTION OF THE DRAWINGS

The accompanying drawings are incorporated in and constitute a part of this application, illustrate the various embodiments of the disclosure, and, together with the description, serve to explain the various embodiments. In the drawings.

DETAILED DESCRIPTION

Reference will now be made in detail to embodiments of the present disclosure, examples of which are illustrated in the accompanying drawings. Wherever possible, the same reference numbers will be used throughout the drawings to refer to the same or like parts. In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense; that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and the appended claims, the use of "correspond," "corresponds," and "corresponding" is intended to describe a ratio of or a similarity between referenced objects. The use of "correspond" or one of its forms should not be construed to mean the exact shape or size.

The present disclosure is directed to a touch sensor formed on a display device. The display device includes a light-emitting element that is integrally formed with a touch sensor. The display device includes various protective layers between the light-emitting element and the touch sensor, with the touch sensor having routing lines that route the touch sensor signals to base layers of the display device around the protective layers.

Figure 1:
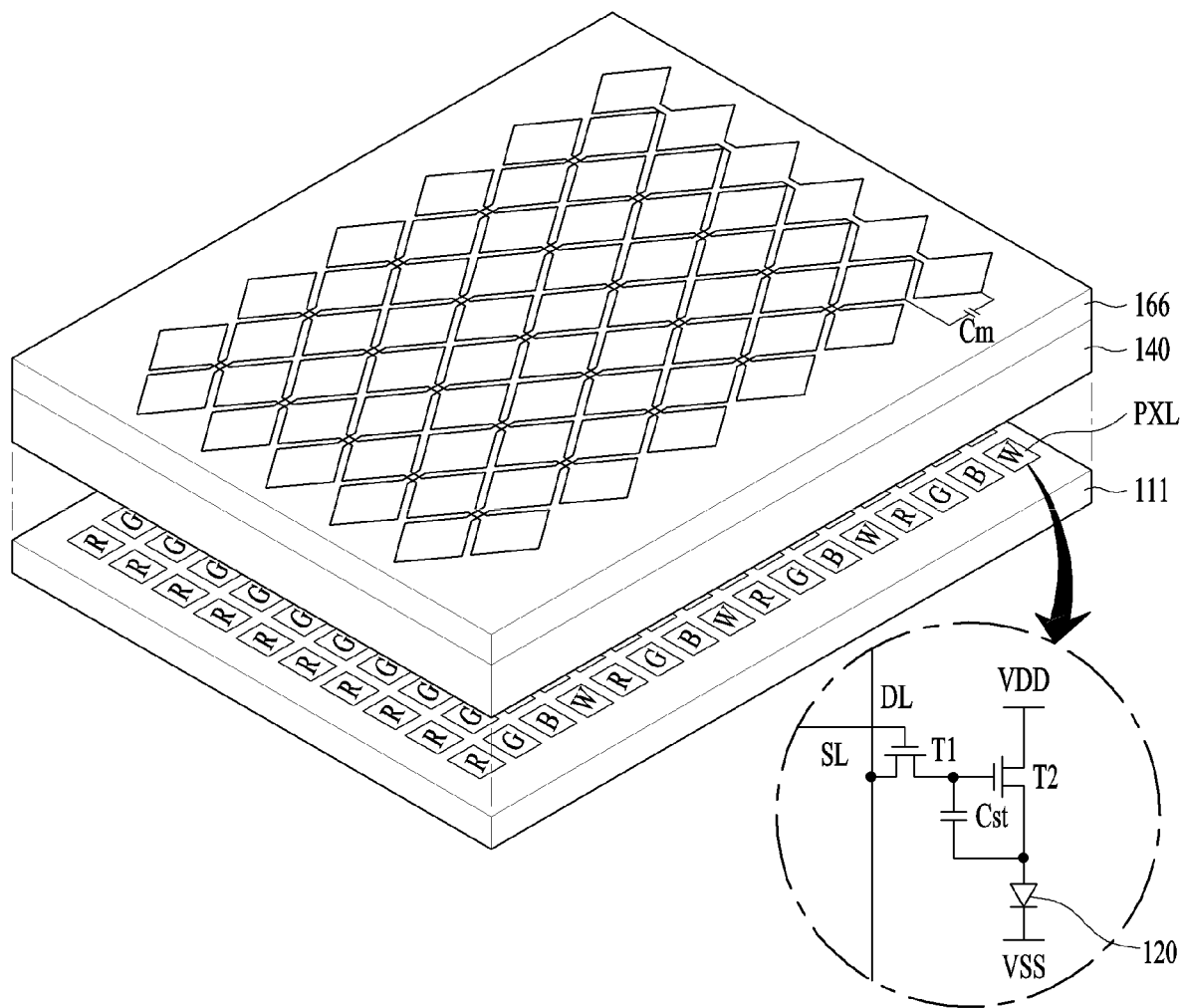
FIG. 1 is an isometric view showing an organic light-emitting display device having a touch sensor according to a first embodiment.

FIG. 1 is an isometric view showing an organic light-emitting display device 100 having a touch sensor 102 according to one embodiment.

Figure 2:
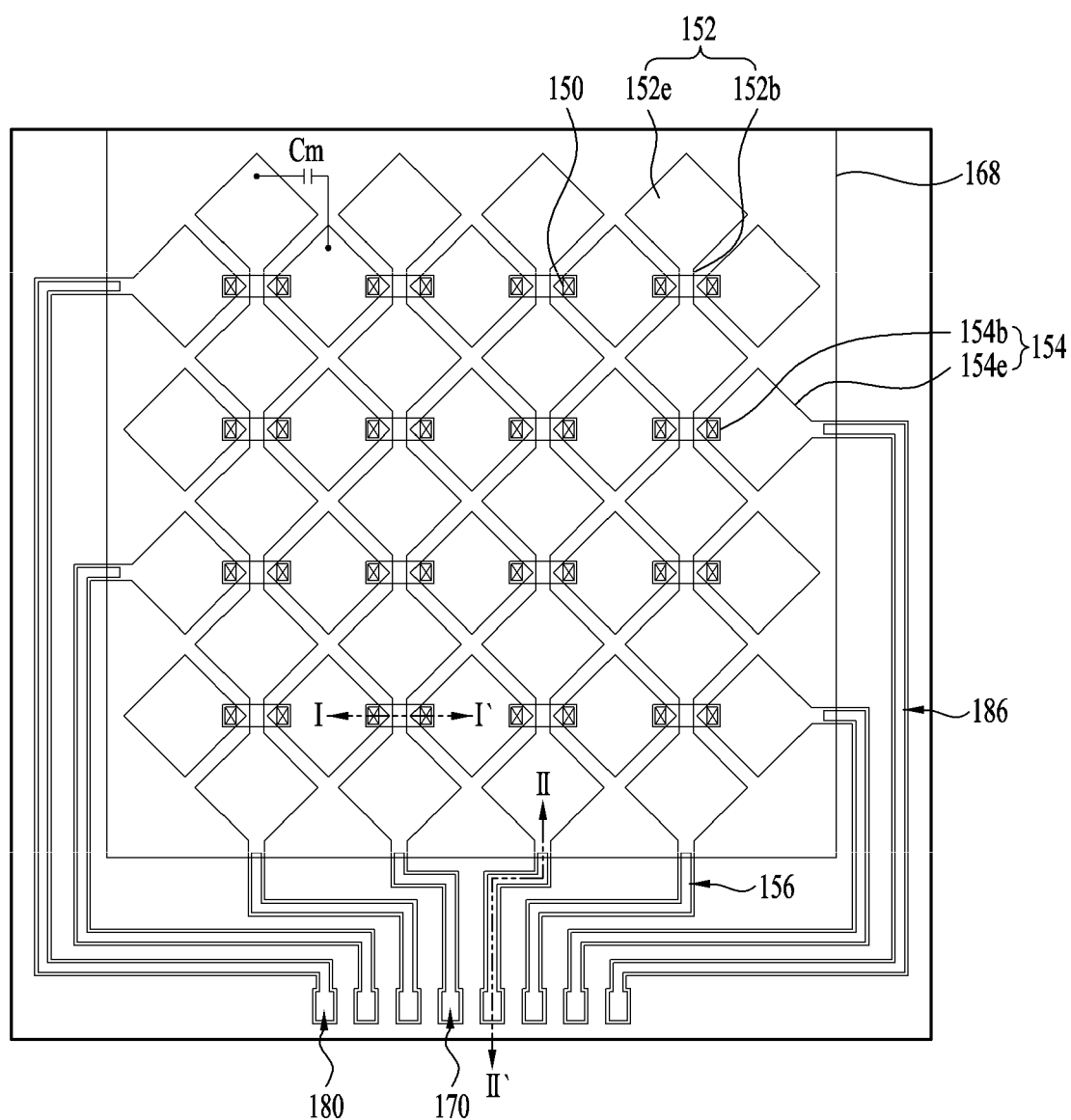
FIG. 2 is a plan view of an organic light-emitting display device having a touch sensor according to one embodiment.

The organic light-emitting display device 100 having the touch sensor 102 shown in FIG. 1 detects variation in capacitance of the mutual capacitor Cm (the touch sensor 102) due to a user's touch through touch electrodes, such as touch electrodes 152e and 154e shown in FIG. 2, during a touch period to sense whether a touch has been performed and the touched position. The organic light-emitting display device 100 having the touch sensor 102 shown in FIG. 1A displays an image through respective stack pixels each including a light-emitting element. Each stack pixel includes red (R), green (G), and blue (B) sub-pixels PXL. Alternatively, each stack pixel may include red (R), green (G), blue (B), and white (W) sub-pixels PXL. Other color combinations are also possible.

To this end, the organic light-emitting display device 100 shown in FIG. 1 includes a plurality of sub-pixels PXL arranged on a substrate 111 in a matrix fashion, an encapsulation stack 140 on the sub-pixels PXL, and mutual capacitor Cm on the encapsulation stack 140. The substrate 111 can be any one of many different substrates. In one embodiment, the substrate is a flexible substrate. In another embodiment, the substrate is a rigid substrate.

As depicted in FIG. 1B, each of the sub-pixels PXL includes a pixel-driving circuit 119 and a light-emitting element 120 connected to the pixel-driving circuit 119. The pixel-driving circuit 119 includes a switching transistor T1, a driving transistor T2, and a storage capacitor Cst.

A scan pulse is supplied to a scan line SL connected to a terminal of the switching transistor T1. The switching transistor T1 is turned on by a data signal provided over a data line DL to transmit a control signal to the storage capacitor Cst and a gate electrode of the driving transistor T2.

In response to the control signal supplied to the gate electrode of the driving transistor T2, the driving transistor T2 controls current I supplied from a high-voltage (VDD) supply line to the light-emitting element 120 to adjust the amount of light emitted by the light-emitting element 120. Even when the switching transistor T1 is turned off, the driving transistor T2 supplies uniform current I to the light-emitting element 120 using the voltage charged in the storage capacitor Cst such that the light-emitting element 120 keeps emitting light until a control signal of the next frame is supplied.

Figure 3:
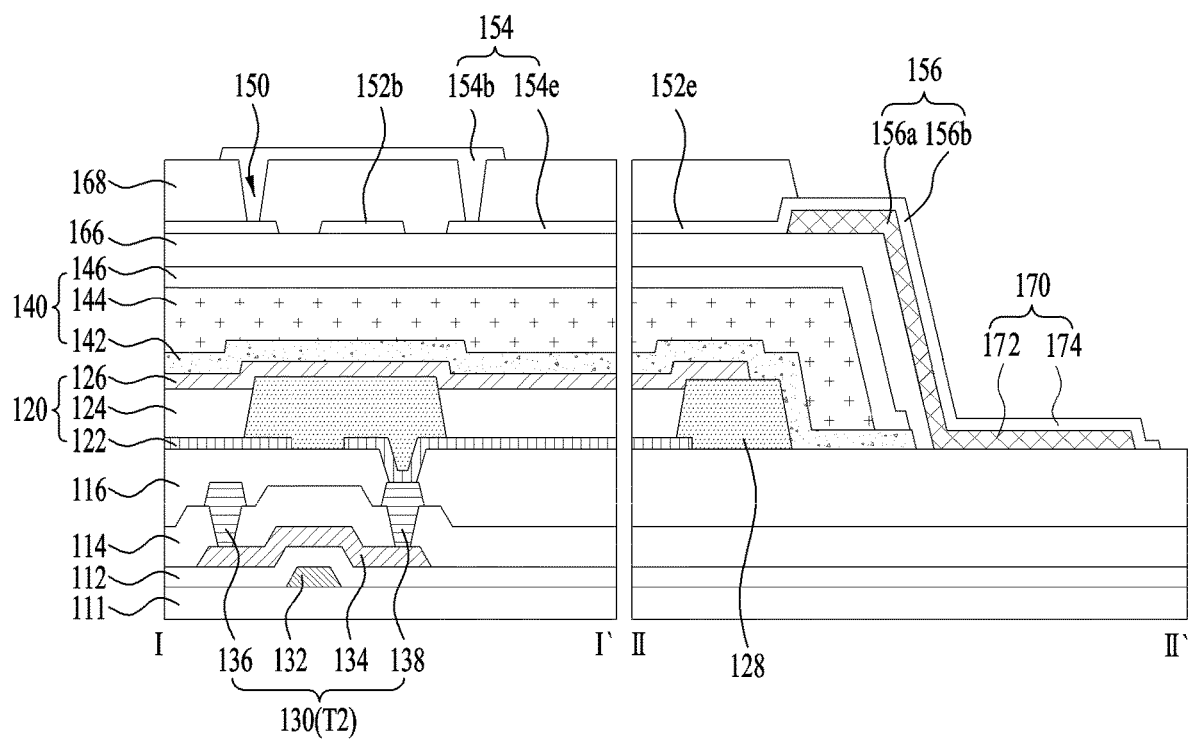
FIG. 3 is a sectional view of an organic light-emitting display device having the touch sensor according to one embodiment.

As shown in FIG. 3, the driving thin film transistor T2 (130) includes a gate electrode 132, a semiconductor layer 134 overlapping the gate electrode 132, with a gate dielectric film 112 between the gate electrode 132 and the semiconductor layer 134. The gate dielectric film 112 is a first dielectric film. The driving thin film transistor T2 (130) also includes source and drain electrodes 136 and 138 formed through an interlayer dielectric film 114 on the semiconductor layer 134. The interlayer dielectric film 114 is a second dielectric film, so as to contact the semiconductor layer 134. The semiconductor layer 134 is formed of at least one material selected from among an amorphous semiconductor material, a polycrystalline semiconductor material, and an oxide semiconductor material.

The light-emitting element 120 includes an anode electrode 122, at least one light-emitting stack 124 formed on the anode electrode 122, and a cathode electrode 126 formed on the light-emitting stack 124.

The anode electrode 122 is electrically connected to the drain electrode 138 of the driving thin film transistor 130, exposed through a pixel contact hole formed through a passivation film 116, which is a third dielectric film.

The light-emitting stack 124 is formed on the anode electrode 122 in a light-emitting area defined by a bank 128. The light-emitting stack 124 can be formed by stacking a hole-related layer, an organic light-emitting layer, and an electron-related layer on the anode electrode 122 in that order or in the reverse order. In an alternate embodiment, the light-emitting stack 124 includes first and second light-emitting stacks opposite each other with a charge generation layer formed therebetween. In this embodiment, the organic light-emitting layer of one of the first and second light-emitting stacks generates blue light, and the organic light-emitting layer of the other of the first and second light-emitting stacks generates yellowish-green light. Consequently, white light is generated by combining the light from the first and second light-emitting stacks. The white light generated by the light-emitting stack 124 may be projected through a color filter (not shown), which is located above or under the light-emitting stack 124, to realize a color image. In addition, each light-emitting stack 124 may generate colored light corresponding to each sub-pixel without an additional color filter to realize a color image. That is, the light-emitting stack 124 of the red (R) sub-pixel may generate red light, the light-emitting stack 124 of the green (G)

sub-pixel may generate green light, and the light-emitting stack 124 of the blue (B) sub-pixel may generate blue light.

The cathode electrode 126 is formed so as to be on an opposite side of the light-emitting stack than the anode electrode 122, with the cathode electrode connected to a low-voltage (VSS) supply line.

The encapsulation stack 140 prevents external moisture or oxygen from permeating into the light-emitting element 120, which has low resistance to degradation in the presence of moisture or oxygen. One embodiment of the encapsulation stack 140 includes first and second inorganic encapsulation layers 142 and 146 and an organic encapsulation layer 144 formed between the first and second inorganic encapsulation layers 142 and 146. The second inorganic encapsulation layer 146 is the uppermost layer. The encapsulation stack 140 includes at least two inorganic encapsulation layers 142 and 146 and at least one organic encapsulation layer 144. In the present disclosure, an encapsulation stack 140 having a structure in which an organic encapsulation layer 144 is disposed between first and second inorganic encapsulation layers 142 and 146 will be described by way of example.

The first inorganic encapsulation layer 142 is formed on the substrate 111, on which the cathode electrode 125 is formed, so as to be closest to the light-emitting element 120. The first inorganic encapsulation layer 142 is formed of an inorganic dielectric material that can be deposited at a low temperature, such as silicon nitride ($SiN_x$), silicon oxide ($SiO_x$), silicon oxide nitride (SiON), or aluminum oxide ($Al_2O_3$). Consequently, the first inorganic encapsulation layer 142 is deposited in a low-temperature environment to reduce the risk of damage to the light-emitting stack 124, which is susceptible to damage in a high-temperature environment.

The organic encapsulation layer 144 reduces stress between the layers due to bending of the organic light-emitting device and improves planarization. The organic encapsulation layer 144 is formed of an organic dielectric material, such as acrylic resin, epoxy resin, polyimide, polyethylene, or silicon oxycarbide (SiOC).

The second inorganic encapsulation layer 146 is formed on the substrate 111, on which the organic encapsulation layer 144 is formed, so as to cover the upper surfaces and the side surfaces of the organic encapsulation layer 144 and the first inorganic encapsulation layer 142. Consequently, the second inorganic encapsulation layer 146 minimizes or prevents external moisture or oxygen from permeating into the first inorganic encapsulation layer 142 and the organic encapsulation layer 144. The second inorganic encapsulation layer 146 is formed of an inorganic dielectric material, such as silicon nitride ($SiN_x$), silicon oxide ($SiO_x$), silicon oxide nitride (SiON), or aluminum oxide ($Al_2O_3$).

A touch buffer film 166 is disposed on the encapsulation stack 140. The touch buffer film 166 is formed between a touch-sensing line 154 and the light-emitting element 120 and between a touch-driving line 152 and the light-emitting element 120. The touch buffer film 166 has a thickness of 500 Å to 5 μm in some embodiments. In some embodiments, the touch buffer film 166 is omitted and the touch driving lines 152, 156 are on a top side of the encapsulation stack 140. Additionally, the distance between the touch-sensing line 154 and the cathode electrode 126 and between the touch-driving line 152 and the cathode electrode 126 is at least 5 μm, in some embodiments. Consequently, it may be possible to reduce minimize the capacitance value of a parasitic capacitor formed between the touch-sensing line 154 and the cathode electrode 126 and between the touch-driving line 152 and the cathode electrode 126, thereby preventing interaction due to coupling between the touch-sensing line 154 and the cathode electrode 126 and between the touch-driving line 152 and the cathode electrode 126. Meanwhile, in the case in which the distance between the touch-sensing line 154 and the cathode electrode 126 and between the touch-driving line 152 and the cathode electrode 126 is less than 5 μm, the touch performance is reduced as the result of interaction due to coupling between the touch-sensing line 154 and the cathode electrode 126 and between the touch-driving line 152 and the cathode electrode 126.

In addition, the touch buffer film 166 may prevent a liquid chemical (e.g. a developing solution or an etching solution), which is used to form the touch-sensing line 154 and the touch-driving line 152, or external moisture from permeating into the light-emitting stack 124. Consequently, the touch buffer film 166 may prevent damage to the light-emitting stack 124, which is susceptible to damage from exposure to liquid chemicals or to moisture.

The touch buffer film 166 is formed of an organic dielectric material at a low temperature, such as 100° C. or lower, and has a low dielectric constant of 1 to 3 in order to prevent damage to the light-emitting stack 124, which has low resistance to high temperatures. For example, the touch buffer film 166 may be formed of an acryl-based material, an epoxy-based material, or a siloxane-based material. The touch buffer film 166, which is formed of an organic dielectric material and exhibits planarization characteristics, may prevent damage to the encapsulation layers 142, 144, and 146 in the encapsulation stack 140 and breakage of the touch-sensing line 154 and the touch-driving line 152, which are formed on the touch buffer film 166, due to bending of the organic light-emitting display device.

The touch-sensing line 154 and the touch-driving line 152 are formed on the touch buffer film 166 so as to overlap each other in the state in which the touch-sensing line 154 and the touch-driving line 152 are separated by a touch dielectric film 168 that is disposed therebetween. Mutual capacitance Cm is formed at the intersection where the touch-sensing line 154 and the touch-driving line 152 are overlap. Consequently, the mutual capacitor Cm is charged by a touch-driving pulse supplied to the touch-driving line 152 and the mutual capacitor Cm is discharged by the touch-sensing line 154. A user's finger in proximity to the touch-driving line 152 and the touch-sensing line 154 changes the capacitance of mutual capacitor Cm, which affects the electrical response to being charged and discharged thereby serving as the touch sensor 102.

The touch-driving line 152 includes a plurality of first touch electrodes 152e and first bridges 152b for electrically interconnecting the first touch electrodes 152e. The first touch electrodes 152e are spaced apart from each other on the touch buffer film 166 by a predetermined distance in a Y direction, which is a first direction. Each of the first touch electrodes 152e is electrically connected to an adjacent first touch electrode 152e via a corresponding one of the first bridges 152b.

The first bridges 152b are disposed on the touch buffer film 166, which is disposed in the same plane as the first touch electrodes 152e, so as to be electrically connected to the first touch electrode 152e without requiring the formation of additional contact holes.

The touch-sensing line 154 includes a plurality of second touch electrodes 154e and second bridges 154b for electrically interconnecting the second touch electrodes 154e. The second touch electrodes 154e are spaced apart from each other on the touch buffer film 166 by a predetermined distance in an X direction, which is a second direction. Each of the second touch electrodes 154e is electrically connected to an adjacent second touch electrode 154e via a corresponding one of the second bridges 154b. The second bridges 154b are formed on the touch dielectric film 168, and are exposed through touch contact holes 150, which are formed through the touch dielectric film 168, so as to be electrically connected to the second touch electrodes 154e. In the same manner as the first bridges 152b, the second bridges 154b are arranged so as to overlap the bank 128. Consequently, it is possible to prevent the reduction of an aperture ratio due to the first and second bridges 152b and 154b.

Figure 4A:
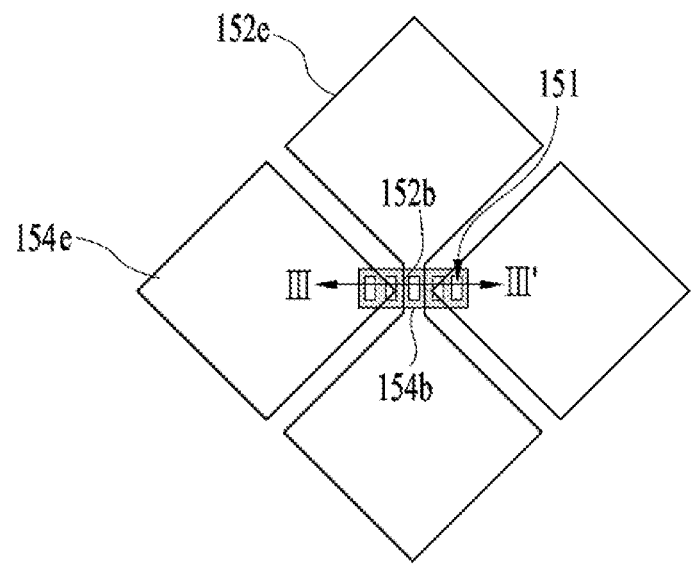
FIG. 4A is a plan view showing another embodiment of the bridge shown in FIG. 3.
Figure 4B:
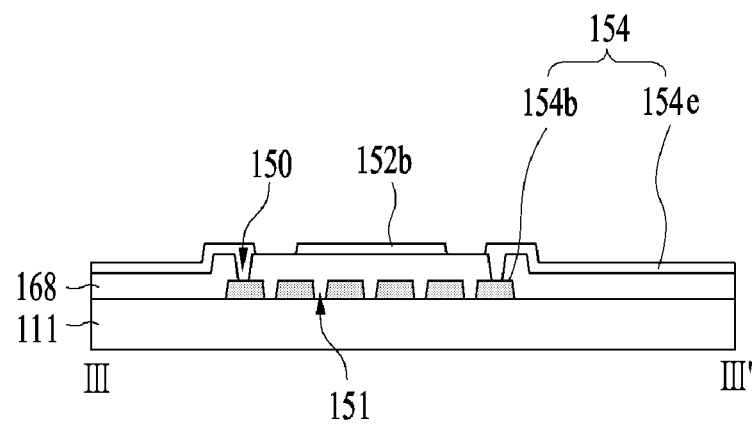
FIG. 4B is a sectional view showing the bridge of FIG. 4A taken at sectional line AA'.

Meanwhile, each of the second bridges 154b, which are disposed in a plane different from the plane in which the touch electrodes 152e and 154e are disposed, may be provided with a plurality of slits 151, as shown in FIG. 4. The area of each second bridge 154b shown in FIG. 4, which has a plurality of slits 151, may be smaller than the area of each second bridge 154b shown in FIG. 2, which has no slits 151. Consequently, it is possible to reduce the amount of external light that is reflected by the second bridges 154b, thereby preventing the reduction of visibility. Each second bridge 154b having the slits 151 is formed of a transparent conductive layer or an opaque conductive layer. In the case in which each second bridge 154b is formed of an opaque conductive layer, the second bridges 154b overlap the bank 128, whereby it is possible to prevent the reduction of an aperture ratio.

Returning to FIG. 3, the touch-driving line 152 is connected to a touch-driving unit (not shown) via a first routing line 156 and a touch-driving pad 170. In addition, the touch-sensing line 154 is connected to the touch-driving unit via a second routing line 186 and a touch-sensing pad 180.

The first routing line 156 electrically connects the touch-driving pad 170 to the first touch electrodes 152e, whereby a touch-driving pulse from the touch-driving pad 170 is transmitted to the touch-driving line 152. The second routing line 186 electrically connects the touch-sensing pad 180 to the second touch electrode 154e, whereby a touch signal from the touch-sensing line 154 is transmitted to the touch-sensing pad 180.

The first and second routing lines 156 and 186 are disposed on the touch buffer film 166 so as to cover the top and side surfaces of the encapsulation stack 140 whereby the first and second routing lines 156 and 186 contact the side surface of the touch buffer film 166. In addition, the first and second routing lines 156 and 186 may contact the side surface of the inorganic encapsulation layer 146 so as to cover the side surface of the encapsulation stack 140 without the touch buffer film 166. Each of the first and second routing lines 156 and 186 includes a first conductive layer 156a and a second conductive layer 156b stacked on the first conductive layer 156a. The first conductive layer 156a is formed of a metal exhibiting high conductivity, such as Al, Ti, Cu, or Mo, so as to have a single- or multi-layer structure. For example, the first conductive layer 156a may be formed to have a three-layer stack structure, such as Ti/Al/Ti or Mo/Al/Mo. A transparent conductive layer exhibiting high corrosion resistance and acid resistance, such as ITO or IZO, is used as the second conductive layer 156b.

In order to contact the dielectric films 112, 114, and 116, disposed between the substrate 111 and the encapsulation unit 140, the touch-driving pad 170 and the touch-sensing pad 180 are disposed on the dielectric film (e.g. the passivation film 116). Each of the touch-driving pad 170 and the touch-sensing pad 180 includes a pad electrode 172 and a pad cover electrode 174 formed on the pad electrode 172 so as to at least partially cover the pad electrode 172.

The pad electrode 172 extends from the first conductive layers 156a of the first and second routing lines 156 and 186. The pad cover electrode 174 extends from the second conductive layers 156b of the first and second routing lines 156 and 186. The pad cover electrode 174 can be formed so as to be exposed by a touch passivation film (not shown). Consequently, the pad cover electrode 174 is connected to a signal transmission film, on which the touch-driving unit is mounted. The touch passivation film is formed so as to cover the touch-sensing line 154 and the touch-driving line 152, and thus may prevent the touch-sensing line 154 and the touch-driving line 152 from being corroded by external moisture. The touch passivation film can be formed of an organic dielectric material, configured in the form of a circular polarizer, or formed of an epoxy or acrylic film.

The organic light-emitting display device having the touch sensor according to the present disclosure, the manufacturing process is conducted at a low temperature after the organic light-emitting element 120 is formed (about 100° C. or lower) in order to protect the light-emitting stack 124, which is vulnerable to damage at high temperatures. The manufacturing process can be changed depending on the materials of a conductive thin film layer and a dielectric thin film layer, which are formed on the organic light-emitting element 120, as is discussed below. Specifically, in the case in which at least one dielectric thin film layer selected from among the organic encapsulation layer 144 of the encapsulation stack 140, the touch dielectric film 168, and the touch buffer film 166, which are disposed on the organic light-emitting element 120, is formed of a photoacryl-based, epoxy-based, Parylene-C, Parylene-N, Parylene-F, or siloxane-based organic film, the dielectric thin film layer is coated on the substrate 111 and is cured at a temperature of 100° C. or lower.

In some embodiments, when at least one dielectric thin film layer selected from among the inorganic encapsulation layers 142 and 146 of the encapsulation stack 140, the touch dielectric film 168, and the touch buffer film 166, which are disposed on the organic light-emitting element 120, is formed of an inorganic film, such as $SiN_x$, SiON, or $SiO_2$, the dielectric thin film layer is deposited on the substrate at a low temperature and washed. This process may be repeated more than once, for example, when the dielectric thin film layer is imparted with a multi-layer structure.

Figure 5:
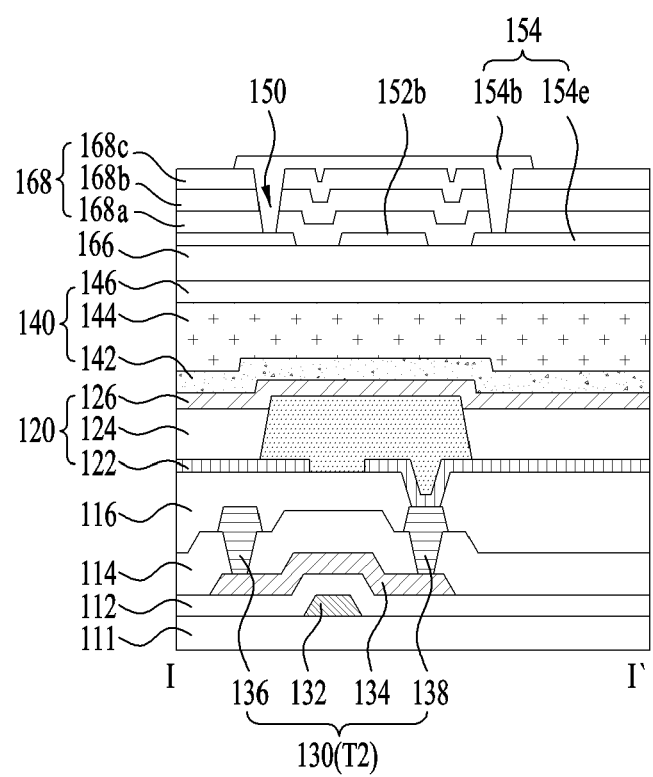
FIG. 5 is a sectional view showing another embodiment of a touch dielectric film shown in FIG. 3.

As shown in FIG. 5, a touch dielectric film 168 is formed to have a three-layer structure including first to third touch dielectric films 168a, 168b, and 168c. When the inorganic dielectric thin film layer is formed through a low-temperature deposition process, particles can be formed in the inorganic dielectric thin film layer by non-reacting material generated due to low activation energy during deposition. When the particles are removed through washing, pores are formed in the portions of the inorganic dielectric thin film layer from which the particles have been removed. In order to prevent the permeation of moisture through the pores, the inorganic dielectric thin film layer is formed to have a multi-layer structure such that the pores in the inorganic dielectric thin film layer are covered by the uppermost dielectric thin film layer. When at least one dielectric thin film layer selected from among the encapsulation stack 140, the touch dielectric film 168, and the touch buffer film 166 is formed to have a multi-layer structure, the respective layers may be formed of the same material, or at least one of the layers may be formed of a material different from the material of the other layers.

In some embodiments, when at least one conductive thin film layer selected from among the first and second touch electrodes 152e and 154e, the first and second bridges 152b and 154b, the first and second routing lines 156 and 186, the touch-sensing pad 180, and the touch-driving pad 170, which are disposed on the organic light-emitting element 120, is formed of a metal material, the conductive thin film layer is formed through a room-temperature deposition process.

In some embodiments, when at least one conductive thin film layer selected from among the first and second touch electrodes 152e and 154e, the first and second bridges 152b and 154b, the first and second routing lines 156 and 186, the touch-sensing pad 180, and the touch-driving pad 170, which are disposed on the organic light-emitting element 120, is formed of a transparent conductive layer, the conductive thin film layer is deposited at room temperature through a deposition process. The deposition process, such as sputtering, may occur without a heat treatment process performed at a temperature of 100° C. or higher, and is crystallized through a laser annealing process. Since the conductive thin film layer is deposited through a low-temperature process, it is possible to prevent damage to the light-emitting stack 124, which is disposed under the conductive thin film layer. In addition, since the conductive thin film layer has a crystalline state, it is possible to reduce the resistance value of the conductive thin film layer and to improve the transmittance of the conductive thin film layer. For example, each of a touch-driving line 152 and a touch-sensing line 154 formed of a crystalline transparent conductive layer having a thickness of 100 Å to 1000 Å may have a resistance of about 40Ω/□ to 150Ω/□, which is low. Consequently, it is possible to maintain a rapid response speed. In addition, each of a touch-driving line 152 and a touch-sensing line 154 formed of a crystalline transparent conductive layer having a thickness of 100 Å to 1000 Å may have a high transmittance of about 80% to 90%.

As described above, in the organic light-emitting display device having the touch sensor, the respective thin film layers (e.g., the touch electrodes 152e and 154e, the touch buffer film 166, and the touch dielectric film 168), which are disposed on the organic light-emitting element 120, are formed through a low-temperature process to reduce the risk of damage to the light-emitting stack 124, which is vulnerable to damage at high temperatures. Furthermore, in a conventional organic light-emitting display device, a touch-screen is generally attached to the conventional organic light-emitting display device using an adhesive. In contrast, in the organic light-emitting display device, the touch electrodes 152e and 154e are formed on the encapsulation stack 140, with the result that an additional bonding process is not required, whereby the process is simplified and costs are reduced.

FIGS. 6A to 6D are sectional views illustrating a method of manufacturing the organic light-emitting display device having the touch sensor shown in FIG. 3.

Figure 6A:
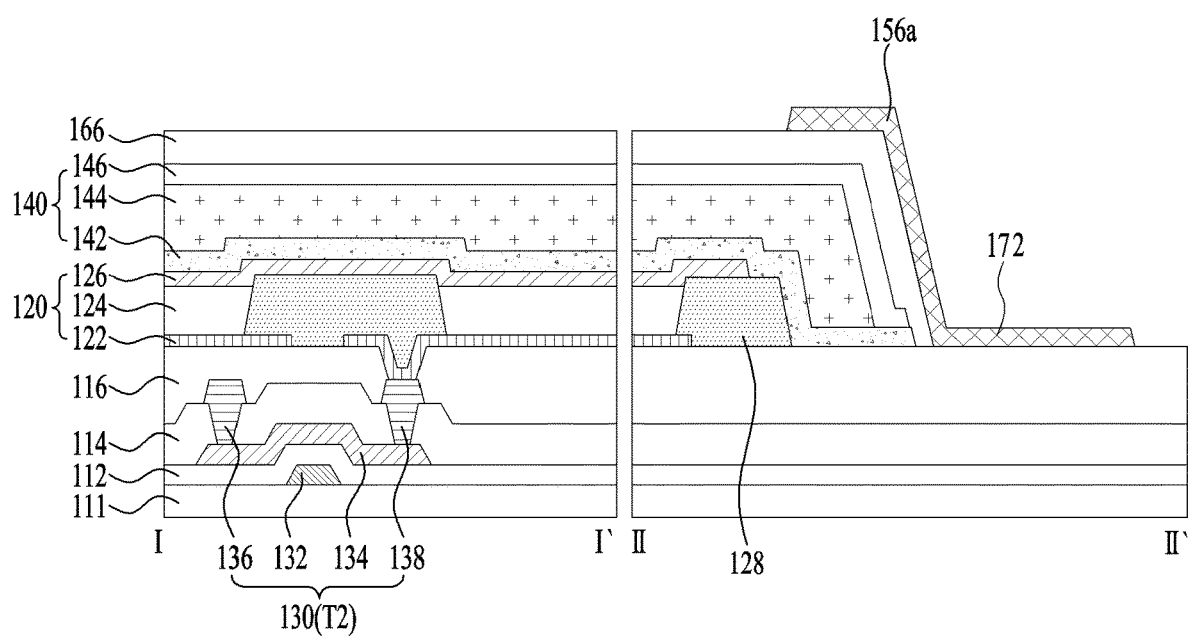
FIGS. 6A to 6D are sectional views illustrating a method of manufacturing the organic light-emitting display device shown in FIG. 3.

Referring to FIG. 6A, a touch buffer film 166, first conductive layers 156a of first and second routing lines 156 and 186, and pad electrodes 172 of a touch-driving pad 170 and a touch-sensing pad 180 are formed over a substrate 111, on which a switching transistor, a driving transistor 130, an organic light-emitting element 120, and an encapsulation stack 140 are formed.

Specifically, an organic dielectric material is on a substrate 111 and over a switching transistor, a driving transistor 130, an organic light-emitting element 120, and an encapsulation stack 140 are formed, using a metal mask and is cured at a curing temperature of 100° C. or lower to form a touch buffer film 166. Subsequently, a first conductive layer is may be deposited as a blanket layer on the touch buffer film 166 at room temperature through a deposition process using sputtering, for example, and the first conductive layer is patterned by photolithography and etching. The etching step forms the first conductive layers 156a of first and second routing lines 156 and 186 and pad electrodes 172 of a touch-driving pad 170 and a touch-sensing pad 180 are formed. Each first conductive layer 156a is formed of a metal exhibiting high corrosion resistance and acid resistance, such as Al, Ti, Cu, or Mo, so as to have a single- or multi-layer structure. For example, each first conductive layer 156a may be formed to have a three-layer stack structure, such as Ti/Al/Ti or Mo/Al/Mo.

Figure 6B:
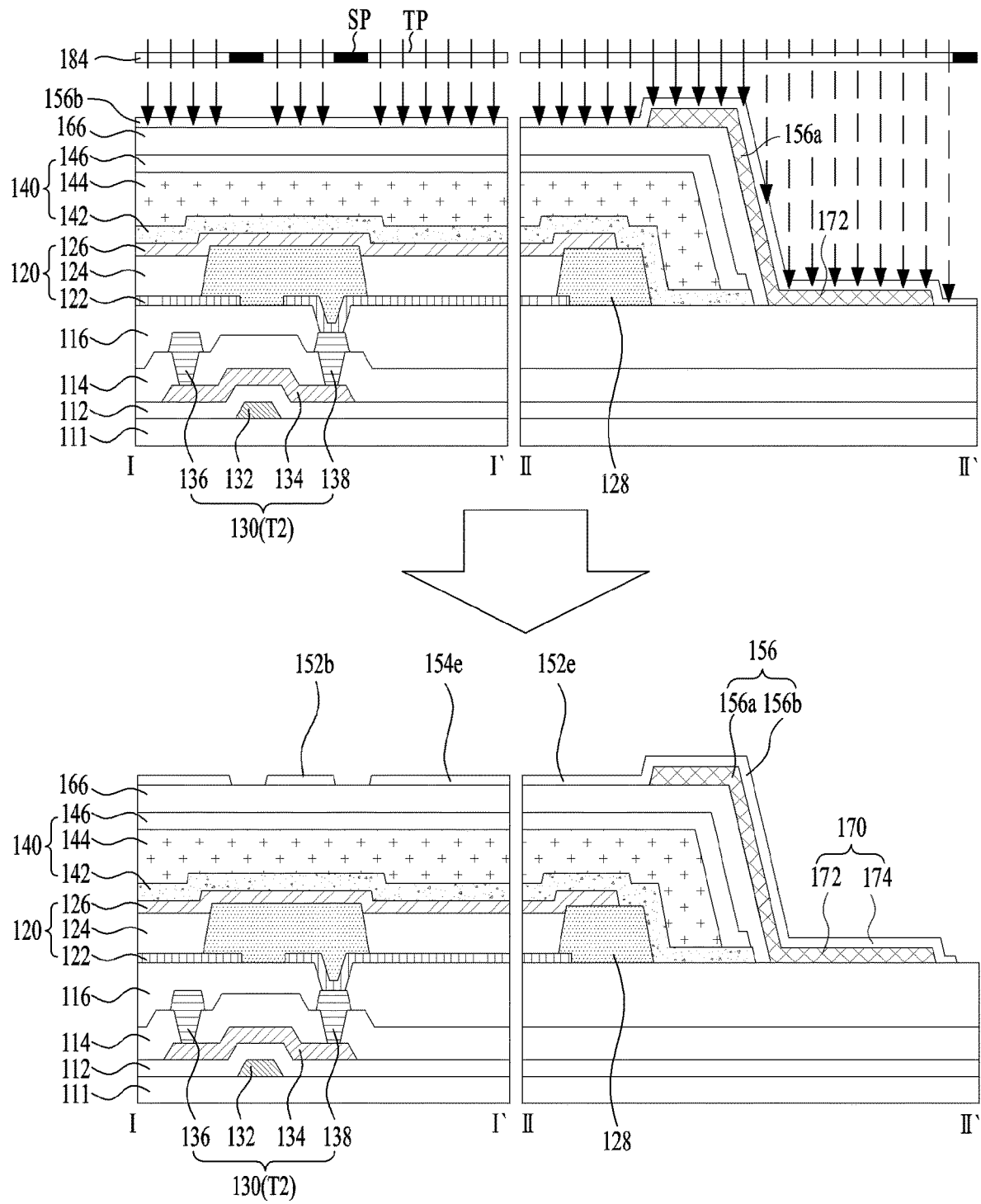

Referring to FIG. 6B, first and second touch electrodes 152e and 154e, first bridges 152b, pad cover electrodes 174, and second conductive layers 156b of the first and second routing lines 156 and 186 are formed on the substrate 111, on which the first conductive layers 156a and the pad electrodes 172 are formed.

Specifically, second conductive layers 156b in an amorphous state, such as ITO or IZO, are deposited as a blanket deposition on the substrate 111, on which the first conductive layers 156a and the pad electrodes 172 are formed, using a deposition method at room temperature, such as sputtering. Subsequently, a laser mask 184 having transmission parts TP and shielding parts SP is aligned over the second conductive layers 156b in the amorphous state. The transmission parts TP in the laser mask 184 correspond to regions in which first and second touch electrodes 152e and 154e, first bridges 152b, pad cover electrodes 174, and first and second routing lines 156 and 186 are to be formed, and the shielding parts SP in the laser mask 184 correspond to the other regions. Laser beams are radiated to the second conductive layers 156b in the amorphous state through the transmission parts TP in the laser mask 184. As the result of such laser annealing, the portions of the second conductive layers 156b corresponding to the transmission parts TP, through which the laser beams are transmitted, are converted from the amorphous state to a crystalline state, and the portions of the second conductive layers 156b corresponding to the shielding parts SP, through which the laser beams are not transmitted, remain in the amorphous state. Subsequently, the second conductive layers 156b in the amorphous state are selectively removed through a wet etching process using an OZ acid solution. As a result, the second conductive layers 156b in the crystalline state are not wet-etched and thus form first and second touch electrodes 152e and 154e, first bridges 152b, and pad cover electrodes 174.

Figure 6C:
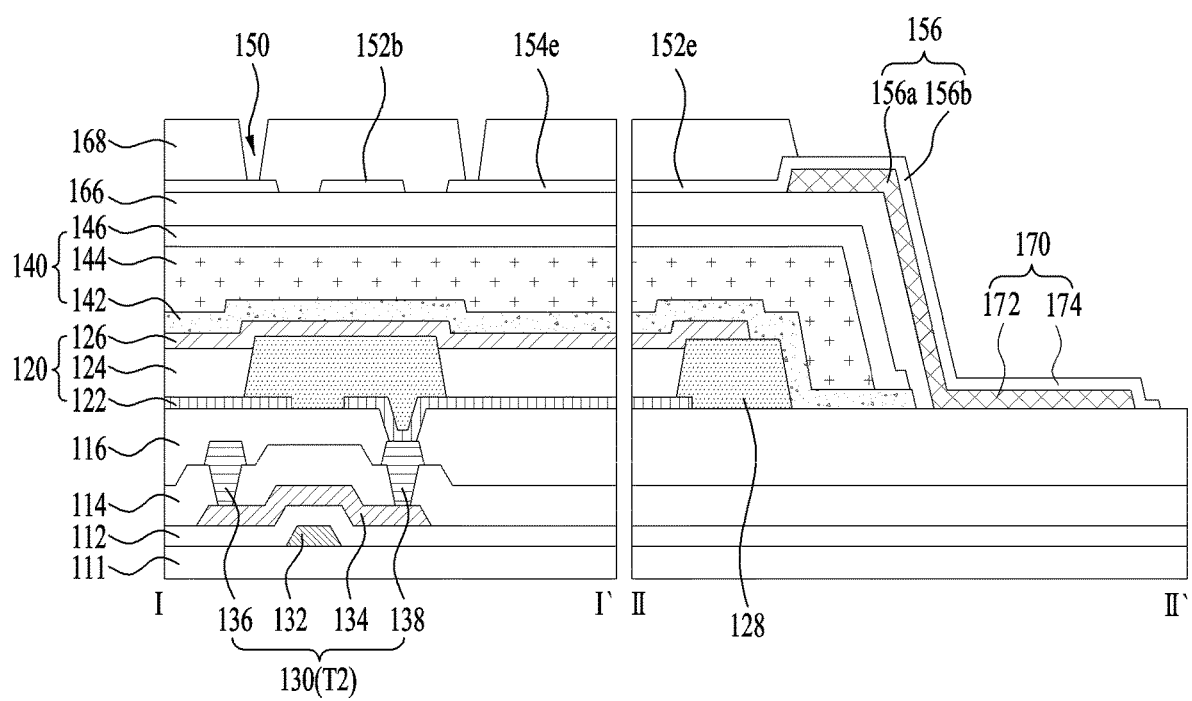

Referring to FIG. 6C, a touch dielectric film 168 having therein touch contact holes 150 is formed over the substrate 111, on which the first and second touch electrodes 152e and 154e and the first bridges 152b are formed.

Specifically, a touch dielectric film 168 having a thickness of 500 Å to 5 μm is formed over the substrate 111, on which the first and second touch electrodes 152e and 154e and the first bridges 152b are formed, through a deposition or coating process. In the case in which an organic film is used to form a touch dielectric film 168, the organic film is coated on the substrate and cured at a temperature of 100° C. or lower to form a touch dielectric film 168. In the case in which an inorganic film is used to form a touch dielectric film 168, a low-temperature chemical vapor deposition (CVD) process and a washing process can be performed repeatedly, at least twice or more, to form a touch dielectric film 168 having a multi-layer structure. Subsequently, the touch dielectric film 168 is patterned by photolithography and etching to form touch contact holes 150.

Figure 6D:
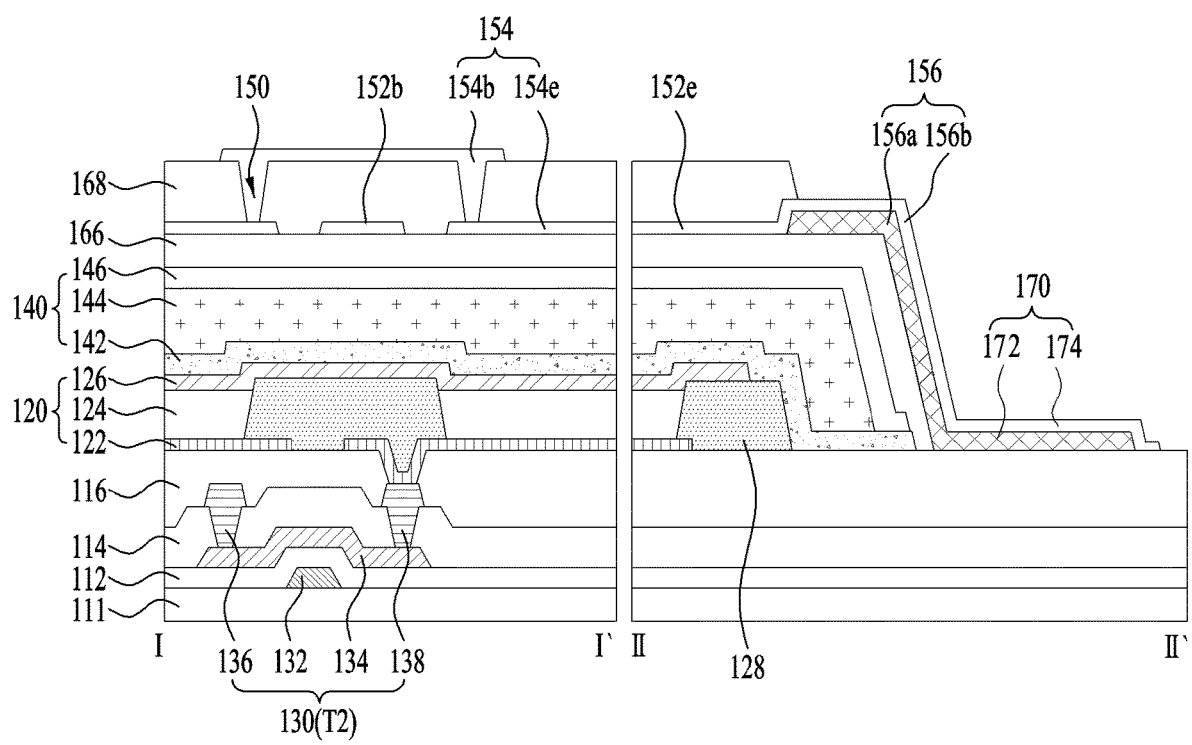

Referring to FIG. 6D, second bridges 154b are formed on the substrate 111, on which the touch dielectric film 168 having therein the touch contact holes 150 is formed. Specifically, a third conductive layer is formed on the substrate 111, on which the touch dielectric film 168 having therein the touch contact holes 150 is formed. In the case in which a metal, such as Al, Ti, Cu, or Mo, is used to form a third conductive layer, the third conductive layer is formed at room temperature using a deposition method, such as sputtering. Subsequently, the third conductive layer is patterned by photolithography and etching to form second bridges 154b.

Figure 7:
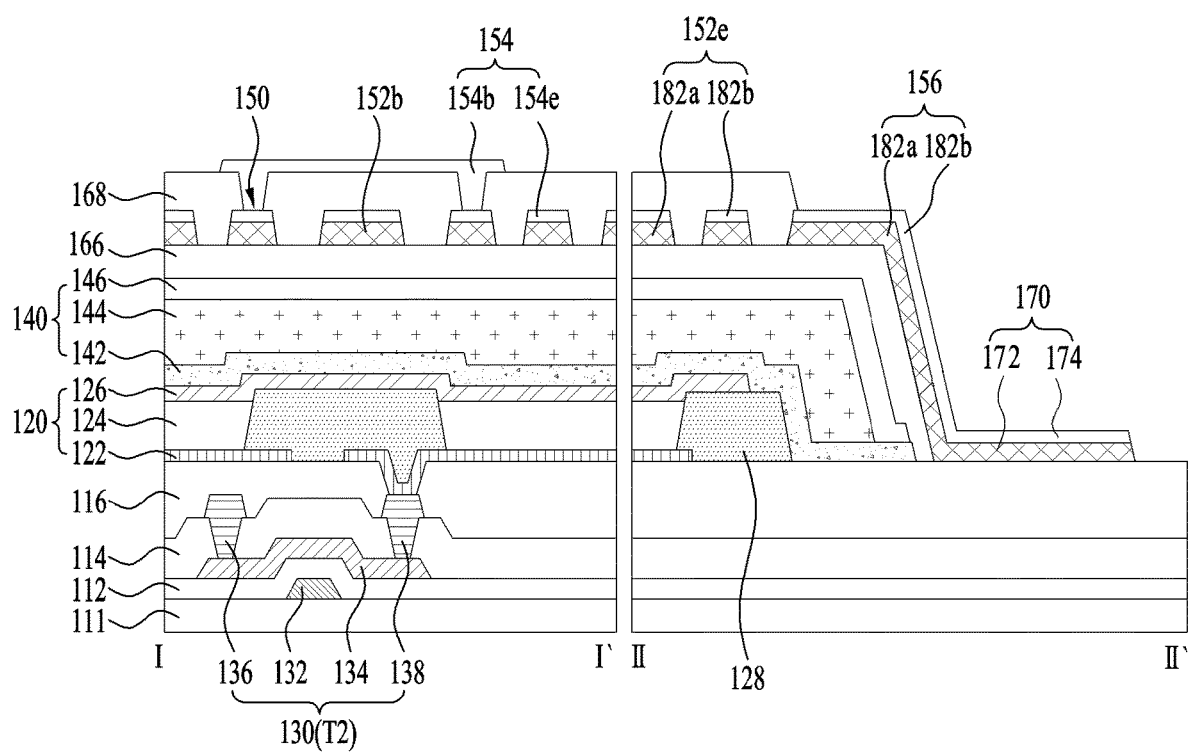
FIG. 7 is a sectional view showing an organic light-emitting display device having a touch sensor according to a second embodiment.

FIG. 7 is a sectional view showing an organic light-emitting display device having a touch sensor according to a second embodiment. The organic light-emitting display device shown in FIG. 7 includes many similar components as the organic light-emitting display device shown in FIG. 3 except that first and second touch electrodes 152e and 154e are formed so as to have a multi-layer structure. Consequently, a detailed description of the same components will be omitted.

The organic light-emitting display device of FIG. 7 includes a touch-driving line and a touch-sensing line coupled to first and second routing lines and a touch-driving pad and a touch-sensing pad, respectively. Each of the touch-driving pad and the touch-sensing pad includes a pad electrode and a pad cover electrode formed on the pad electrode so as to at least partially cover the pad electrode. Each of the first and second routing lines includes a first conductive layer and a second conductive layer stacked on the first conductive layer. The touch-driving line includes a plurality of first touch electrodes and first bridges for electrically interconnecting the first touch electrodes. The touch-sensing line includes a plurality of second touch electrodes and second bridges for electrically interconnecting the second touch electrodes. The first and second touch electrodes are covered by a touch dielectric film with contact through holes for the second bridges to connect to the second touch electrodes.

Figure 8:
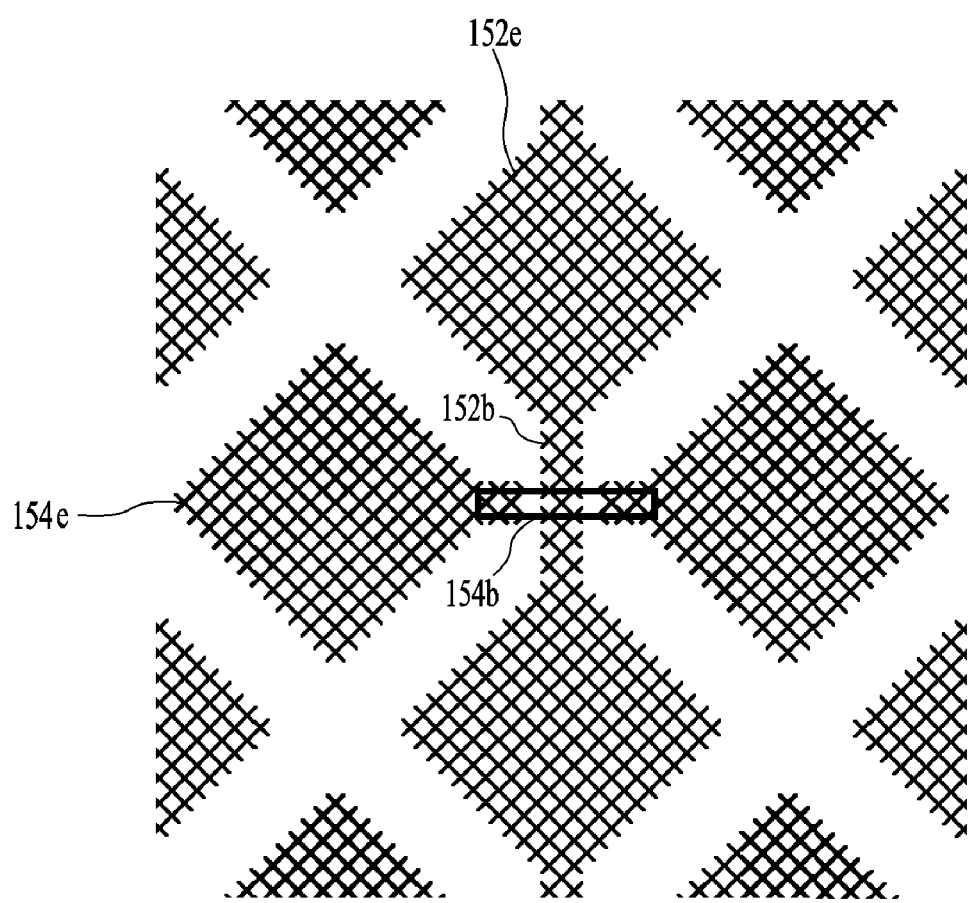
FIG. 8 is a detailed plan view of a touch electrode shown in FIG. 7.

Each of the first and second touch electrodes 152e and 154e shown in FIG. 7 is configured to have a structure in which first and second conductive layers 182a and 182b having the same line width and the same shape are sequentially stacked. Each of the first and second touch electrodes 152e and 154e having the structure in which the first and second conductive layers 182a and 182b are stacked is formed in a mesh shape, as shown in FIG. 8. The first conductive layer 182a is formed of an opaque metal exhibiting high conductivity, such as Al, Ti, Cu, or Mo, so as to have a single- or multi-layer structure. For example, the first conductive layer 182a may be formed to have a three-layer stack structure, such as Ti/Al/Ti or Mo/Al/Mo. A crystalline transparent conductive layer exhibiting high corrosion resistance and acid resistance, such as ITO or IZO, is used as the second conductive layer 182b.

Since the first conductive layer 182a has higher conductivity than the second conductive layer 182b, the first and second touch electrodes 152e and 154e may be formed as low-resistance electrodes. Consequently, the resistance and capacitance of the first and second touch electrodes 152e and 154e are reduced, whereby an RC time constant is reduced and thus touch sensitivity is improved. In addition, the line width of the first and second touch electrodes 152e and 154e, which are formed in the mesh pattern, is very small, with the result that it is possible to prevent the reduction of an aperture ratio and transmittance due to the opaque first conductive layers 182a included in the first and second touch electrodes 152e and 154e.

Figure 9A:
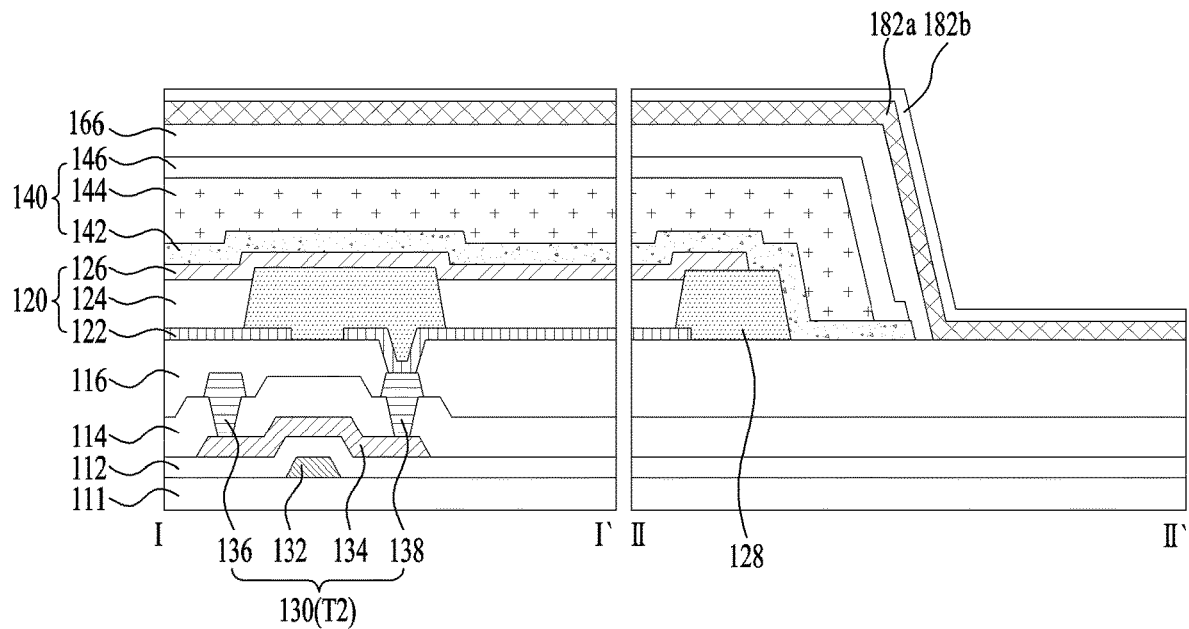
FIGS. 9A to 9E are sectional views illustrating various steps of a method of manufacturing the organic light-emitting display device shown in FIG. 7.
Figure 9B:
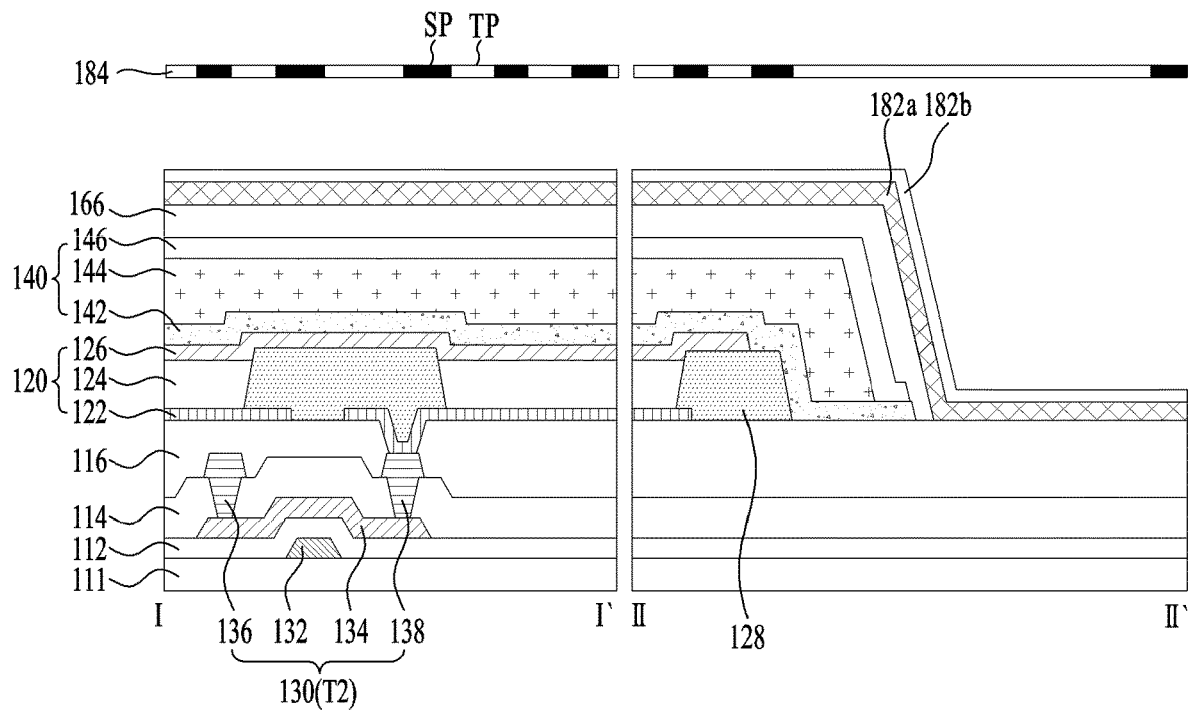
Figure 9C:
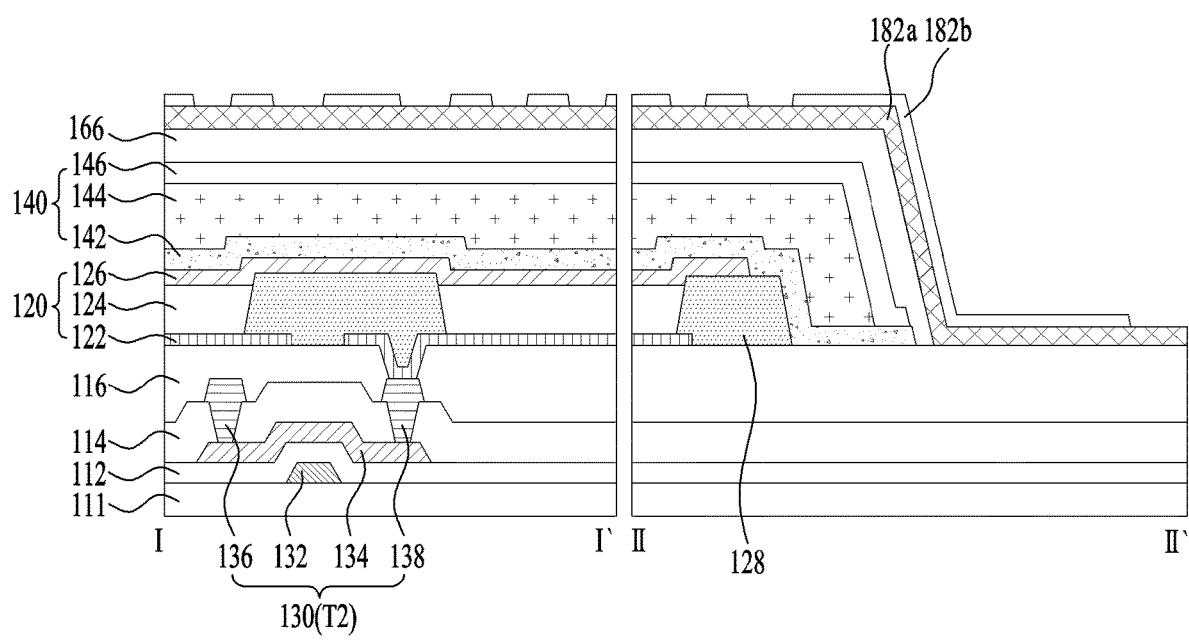
Figure 9D:
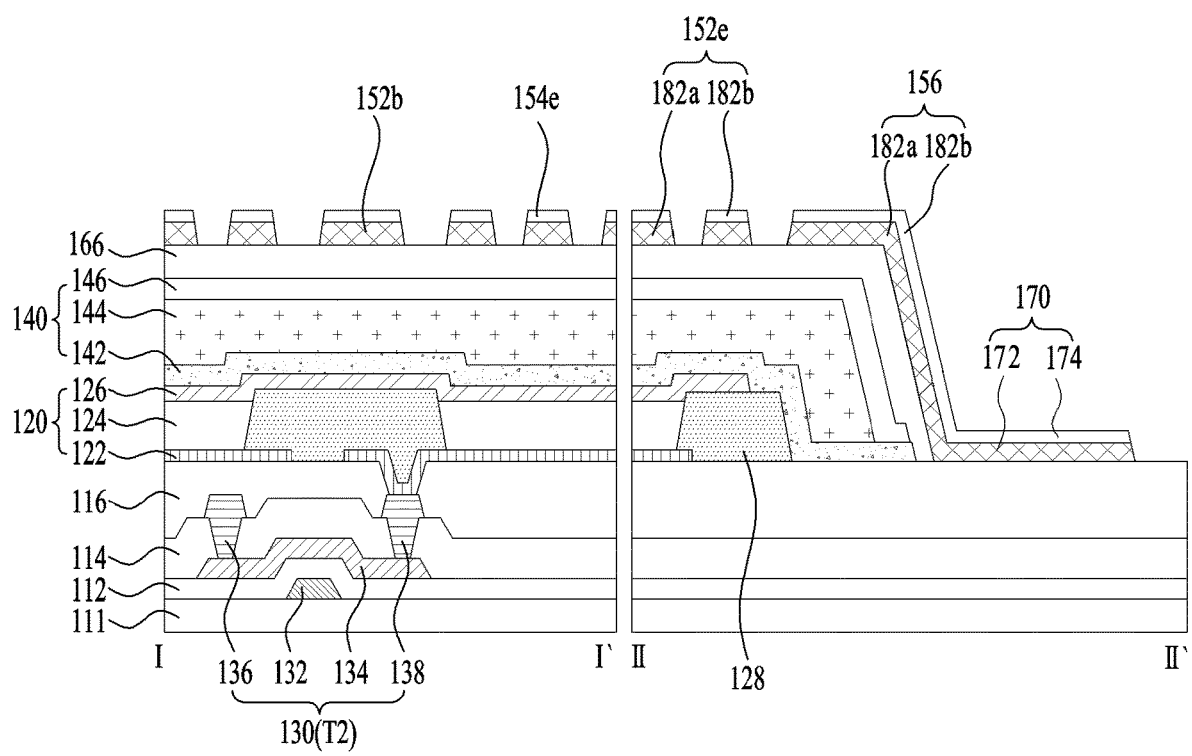
Figure 9E:
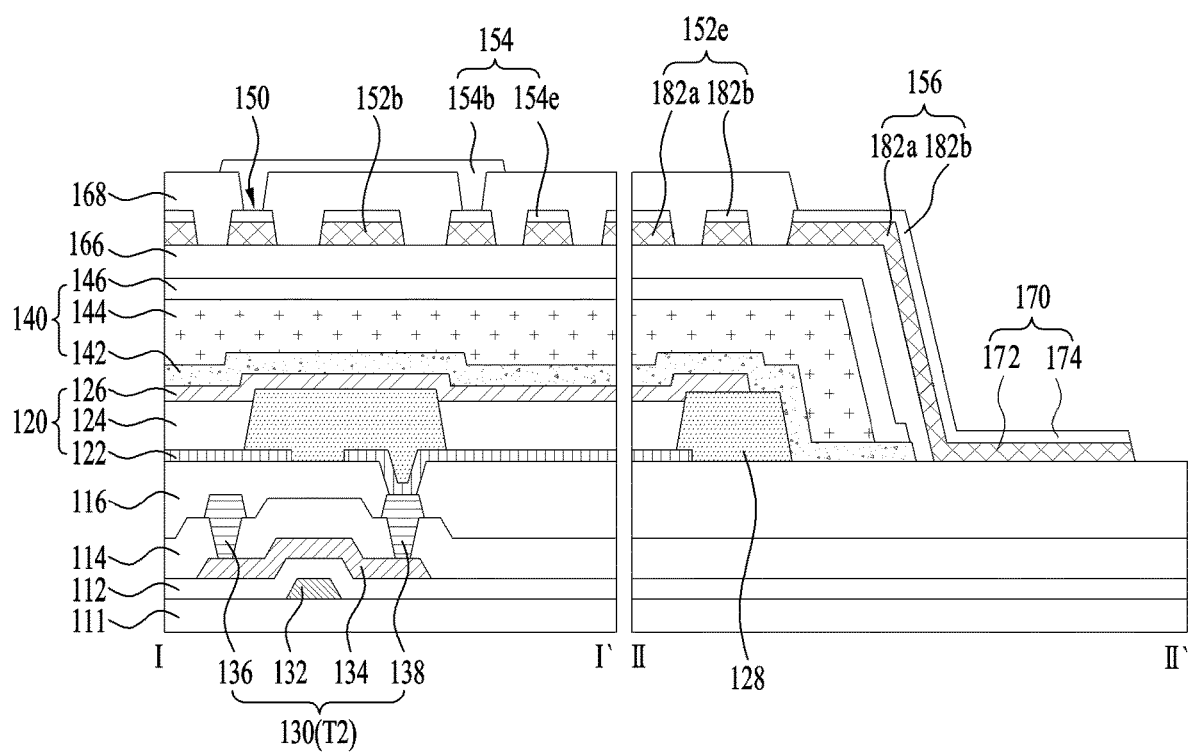

FIGS. 9A to 9E are sectional views illustrating various steps of a method of manufacturing the organic light-emitting display device shown in FIG. 7. First, an organic dielectric material is coated over a substrate 111, on which a switching transistor, a driving transistor 130, an organic light-emitting element 120, and an encapsulation stack 140 are formed, using a metal mask. The organic dielectric material is then cured at a curing temperature of 100° C. or lower to form a touch buffer film 166, as shown in FIG. 9A. Subsequently, first and second conductive layers 182a and 182b are sequentially deposited on the touch buffer film 166 at room temperature through a deposition process, such as sputtering. The first conductive layer 182a is formed of a metal exhibiting high conductivity, such as Al, Ti, Cu, or Mo, so as to have a single- or multi-layer structure. A transparent conductive layer in an amorphous state, such as ITO or IZO, is used as the second conductive layer 182b. Subsequently, a laser mask 184 having transmission parts TP and shielding parts SP is disposed on aligned over the second conductive layer 182b in the amorphous state, as shown in FIG. 9B. The transmission parts TP in the laser mask 184 correspond to regions in which first and second touch electrodes 152e and 154e, first bridges 152b, first and second routing lines 156 and 186, a touch-sensing pad 180, and a touch-driving pad 170 are to be formed, and the shielding parts SP in the laser mask 184 correspond to the other regions. Laser beams are radiated to the second conductive layer 182b in the amorphous state through the transmission parts TP in the laser mask 184. As the result of such laser annealing, the portions of the second conductive layer 156b corresponding to the transmission parts TP, through which the laser beams are transmitted, are converted from the amorphous state to a crystalline state, and the portions of the second conductive layer 182b corresponding to the shielding parts SP, through which the laser beams are not transmitted, remain in the amorphous state. Subsequently, the second conductive layer 182b in the amorphous state is selectively removed through a wet etching process using an OZ acid solution, as shown in FIG. 9C, and the second conductive layer 182b in the crystalline state are not wet-etched. Subsequently, the first conductive layer 182a is etched through a wet etching process using the second conductive layer 182b in the crystalline state as a mask to form first and second touch electrodes 152e and 154e, first bridges 152b, first and second routing lines 156 and 186, a touch-sensing pad 180, and a touch-driving pad 170, as shown in FIG. 9D. Subsequently, as shown in FIG. 9E, a touch dielectric film 168 having a thickness of 500 Å to 5 μm is formed over the substrate 111 through a deposition or coating process, and the touch dielectric film 168 is patterned by photolithography and etching to form touch contact holes 150. Subsequently, a third conductive layer is deposited on the touch dielectric film 168 having therein the touch contact holes 150 at room temperature using a deposition method, such as sputtering, and is then patterned by photolithography and etching to form second bridges 154b.

Figure 10:
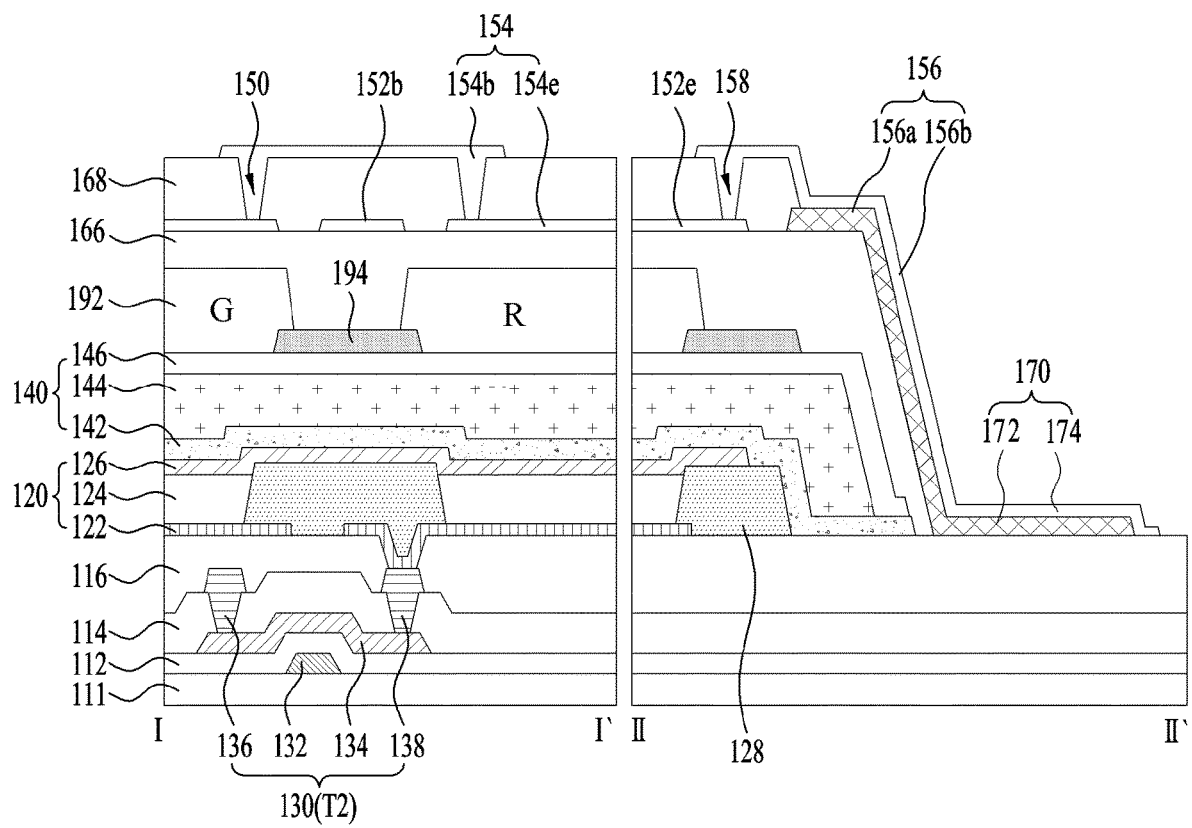
FIG. 10 is a sectional view showing an organic light-emitting display device having a touch sensor according to a third embodiment, wherein the organic light-emitting display device includes a color filter.

FIG. 10 is a sectional view showing an organic light-emitting display device according to a third embodiment of the present disclosure. The organic light-emitting display device shown in FIG. 10 includes many similar components as the organic light-emitting display device shown in FIG. 3. However, the organic light-emitting display device shown in FIG. 10 further includes a color filter 192 disposed on an encapsulation stack 140 or a touch buffer film 166 so as to be located between the encapsulation stack 140 and touch electrodes 152e and 154e. Consequently, a detailed description of the same components will be omitted.

The organic light-emitting display device includes a buffer layer between the encapsulation stack and the touch-driving line 152 and the touch-sensing line 154, and a the touch dielectric film on the first and second touch electrodes 152e and 154e, with additional contact through holes 158 which are filled by a second conductive layer.

Figure 12:
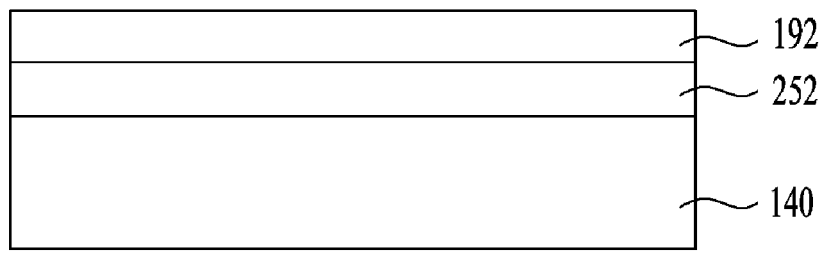
FIG. 12 is a sectional view of an alternative embodiment to FIG. 10 in which the color filter is disposed on the touch electrodes.

The color filter 192 is formed between a touch-sensing line 154 and a light-emitting element 120 and between a touch-driving line 152 and the light-emitting element 120, together with the touch buffer film 166. The distance between the touch-sensing line 154 and the light-emitting element 120 and between the touch-driving line 152 and the light-emitting element 120 is increased by the color filter 192 and the touch buffer film 166. Consequently, it is possible to minimize the capacitance value of a parasitic capacitor formed between the touch-sensing line 154 and the light-emitting element 120 and between the touch-driving line 152 and the light-emitting element 120, thereby reducing interaction due to coupling between the touch-sensing line 154 and the light-emitting element 120 and between the touch-driving line 152 and the light-emitting element 120. In addition, the touch buffer film 166 and the color filter 192 may prevent a liquid chemical (e.g., a developing solution or an etching solution), which is used to form the touch-sensing line 154 and the touch-driving line 152, which is disposed on the touch buffer film 166, or external moisture from permeating into the light-emitting stack 124. Consequently, the touch buffer film 166 and the color filter 192 may reduce the risk of damage to the light-emitting stack 124, which degrades in the presence of liquid chemicals or moisture. As shown in FIG. 10, the touch electrodes have been described as being disposed on the color filter 192 by way of example. Alternatively, as shown in FIG. 12, the color filter 192 may be disposed on the touch electrodes 252. FIG. 12 illustrates the color filters 192 schematically as a layer; however, it will be readily appreciated that the color filters 192 shown in FIG. 12 includes a plurality of separate color filters of various colors, as previously described herein. Similarly, the touch electrodes 252 are depicted in FIG. 12 schematically as a layer; however, it will be readily appreciated that the touch electrodes represented at 252 are the same touch electrodes 152e, 154e as previously described herein. In this case, the touch electrodes 152e and 154e are disposed between the color filter 192 and the encapsulation stack 140.

A black matrix 194 is disposed between color filters 192. The black matrix serves to divide sub-pixel areas from each other and to prevent optical interference between adjacent sub-pixels and screen bleed. The black matrix 194 may be formed of a high-resistance black dielectric material, or may be formed by stacking at least two of red (R), green (G), and blue (B) color filters 192.

As described above with respect to some of the various embodiments, the respective thin film layers (e.g. the touch electrodes, the touch buffer film, and the touch dielectric film of the various embodiments), which are disposed on the organic light-emitting element 120, are formed through a low-temperature process, thereby reducing the risk of damage to the light-emitting element 120. Furthermore, in a conventional organic light-emitting display device, a touchscreen is generally attached to the organic light-emitting display device using an adhesive. In contrast, in the organic light-emitting display device according to the present disclosure, the touch electrodes 152e and 154e are disposed on the encapsulation unit 140, with the result that an additional bonding process is not required, whereby the process is simplified and costs are reduced.

Figure 11:
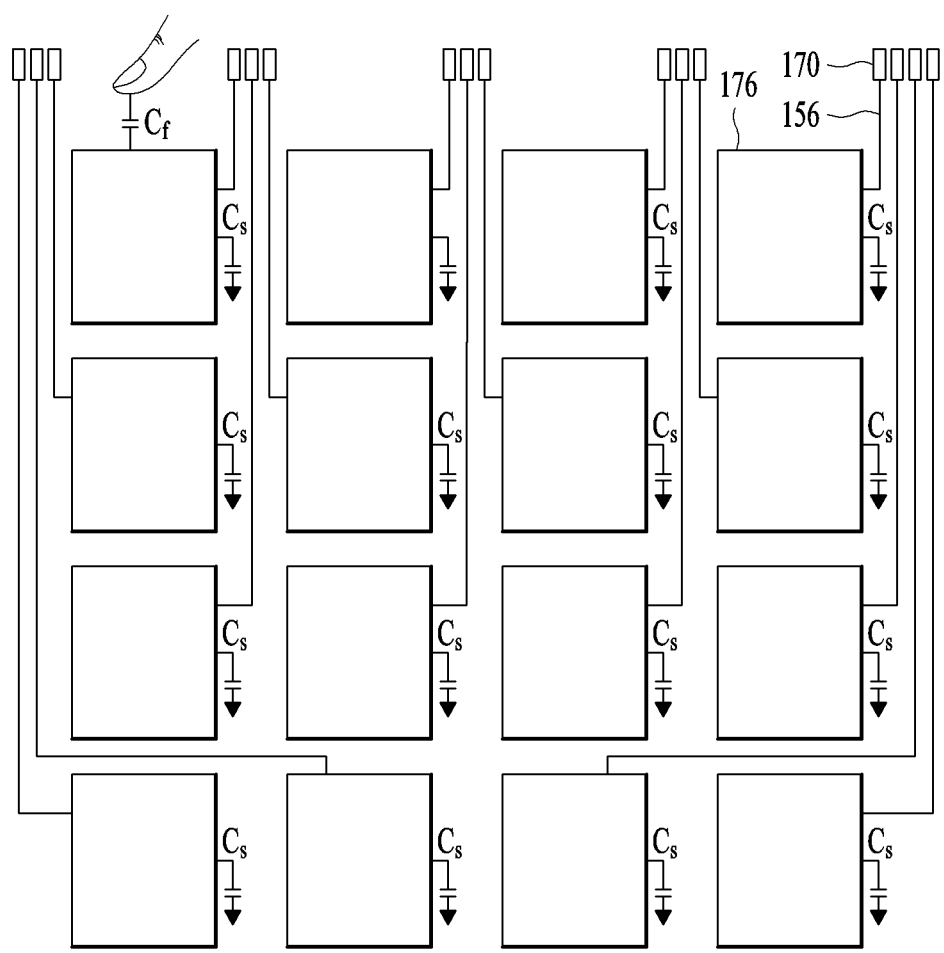
FIG. 11 is a plan view showing an organic light-emitting display device having a self-capacitance type touch sensor according to one embodiment.

The bridges 154b and the second touch electrodes 154e of the touch-sensing line 154 have been described by way of example as being formed in different planes and being connected to each other via the touch contact holes 150. Alternatively, the bridges 152b and the first touch electrodes 152e of the touch-driving line 152 may be disposed in different planes and may be connected to each other via the touch contact holes 150. Furthermore, the mutual-capacitance type touch sensor formed between the touch-sensing line 154 and the touch-driving line 152, which intersect each other, has been described by way of example. Alternatively, self-capacitance type touch sensors Cs shown in FIG. 11 may be used. A plurality of touch electrodes 176 shown in FIG. 11 has electrically independent self-capacitances. Consequently, the touch electrodes may be used as self-capacitance type touch sensors Cs for detecting variation in mutual capacitance due to a user's touch. In a self-capacitance sensing method using the touch electrodes 176, when a driving signal supplied through the touch pad 170 is applied to the touch electrodes 176 via the routing line 156, electric charges Q are accumulated in the touch sensors Cs. At this time, when a user's finger or a conductive object contacts one of the touch electrodes 176, parasitic capacitance Cf is further applied to the self-capacitance type touch sensor Cs, whereby the capacitance value is changed. As a result, a difference in the capacitance value between the touch sensor Cs that the finger has contacted and the touch sensors Cs that the finger has not contacted is formed, whereby it is possible to determine whether the touch has been performed. The touch electrodes 176 shown in FIG. 11 are disposed on the encapsulation stack 140 or the touch buffer film 166 so as to cover the light-emitting element 120, in the same manner as in the mutual-capacitance type touch electrodes 152e and 154e shown in FIG. 3. In this case, the touch electrodes 176 shown in FIG. 11 and the routing line 156 connected to the touch electrodes 176 may be formed through a deposition process conducted at a low temperature (between room temperature and 100° C.), a laser annealing process, or an etching process so as to exhibit crystalline characteristics. Consequently, it is possible to prevent damage to the light-emitting stack 124 at the time of forming the touch electrodes 176.

As can be appreciated from the above description, the touch electrodes are formed through a low-temperature deposition process onto the light emitting element, and the state of the touch electrodes is changed to a crystalline state through a laser annealing process. It is thus possible to form the touch electrodes so as to have low resistance and to reduce the risk of damage to the light-emitting stack. In addition, the touch electrodes may be formed through a laser annealing process and a wet etching process. Consequently, it is possible to reduce the number of processes and to minimize the amount of etching to be performed, compared to a conventional method of forming the touch electrodes by photolithography and etching. In particular, it is possible to form the touch electrodes without a photoresist coating process, a developing process, or a stripping process, whereby it is possible to minimize the number of processes and thus to reduce costs. Furthermore, in a conventional organic light-emitting display device, a touchscreen is generally attached to the conventional organic light-emitting display device using an adhesive. In contrast, the touch electrodes of the present disclosure can be formed directly on the encapsulation stack without an adhesive, and the touch pads can be formed on the dielectric film between the substrate and the encapsulation stack. As a result, an additional bonding process is not required, whereby the process is simplified and costs are reduced.

It will be apparent to those skilled in the art that various modifications and variations can be made in the embodiments without departing from the spirit or scope of the disclosure. Thus, it is intended that the present disclosure covers all modifications and variations of the embodiments, and their equivalents, that come within the scope of any part of the disclosure including the specification, the figures, and the appended claims.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a substrate;
   a light-emitting element disposed on the substrate;
   an encapsulation stack disposed on the light-emitting element;
   a touch buffer film on the encapsulation stack;
   at least one layer of dielectric film disposed between the substrate and the encapsulation stack;
   a plurality of touch electrodes disposed on the touch buffer film, at least one of the plurality of touch electrodes being formed of a crystalline transparent conductive layer, the plurality of touch electrodes including a first plurality of touch electrodes and a second plurality of touch electrodes;
   a touch pad electrically connected to the first plurality of touch electrodes, the touch pad on the at least one layer of dielectric film and the touch buffer film;
   a first bridge electrically connecting the first plurality of touch electrodes
   a second bridge electrically connecting the second plurality of touch electrodes,
   a touch dielectric film disposed between the first bridge and the second bridge and disposed on the touch buffer film; and
   a routing line electrically connected to the touch pad and to the touch electrodes, wherein the routing line contacts a side surface of the touch buffer film disposed under the first and second bridge.

2. The display device according to claim 1, wherein the routing line covering a side surface of the encapsulation stack.

3. The display device according to claim 2, wherein the routing line includes a first layer and a second layer, the first layer being a metal and the second layer being formed of a crystalline transparent conductive layer.

4. The display device according to claim 1, wherein the touch pad includes a first conductive layer and a second conductive layer, the first conductive layer being a metal and the second conductive layer being formed of a crystalline transparent conductive layer.

5. The display device according to claim 4, wherein the first plurality of touch electrodes is a same layer as the second layer of the touch pad.

6. The display device according to claim 1, wherein the first plurality of touch electrodes arranged on the encapsulation stack in a first direction; and the second plurality of touch electrodes arranged on the encapsulation stack in a second direction, the second direction orthogonal to the first direction.

7. The display device according to claim 6, wherein each of the first and second plurality of touch electrodes is formed of a crystalline transparent conductive layer.

8. The display device according to claim 6, wherein each one of the first and second plurality of touch electrodes includes a first layer and a second layer.

9. The display device according to claim 8, wherein each of the first conductive layers of the first and second plurality of touch electrodes comprises a crystalline transparent conductive layer and each of the second conductive layers of the first and second plurality of touch electrodes comprises an opaque conductive layer disposed under the crystalline transparent conductive layers of the first and second touch electrodes.

10. The display device according to claim 1, wherein at least one of the first and second bridges has at least one slit.

11. The display device according to claim 1, wherein the encapsulation stack comprises:
    a first inorganic encapsulation layer disposed on the light-emitting element;
    a second inorganic encapsulation layer disposed on the light-emitting element; and
    an organic encapsulation layer disposed between the first and second inorganic encapsulation layers.

12. The display device according to claim 11, wherein at least one of the touch dielectric film and the organic encapsulation layer is formed from at least one of a photoacryl-based, epoxy-based, Parylene-C, Parylene-N, Parylene-F, and siloxane-based organic film.

13. The display device according to claim 11, wherein at least one of the touch dielectric film and the inorganic encapsulation layers is formed from an inorganic film having a multi-layer structure including $SiN_x$, $SiON$, or $SiO_2$.

14. The display device according to claim 1, wherein each of the plurality of touch electrodes is formed in a mesh pattern.

15. The display device according to claim 1, wherein each of the plurality of touch electrodes is configured to detect an electrically independent self-capacitance.

16. The display device according to claim 1, further comprising a color filter disposed between the encapsulation stack and the plurality of touch electrodes.

17. The display device according to claim 1, further comprising:
    a color filter disposed on the plurality of touch electrodes, the plurality of touch electrodes being between the color filter and the encapsulation stack.

18. The display device according to claim 1, further comprising:
    a transistor connected to the light-emitting element;
    a first dielectric film disposed between a gate electrode and an active layer of the transistor;
    a second dielectric film disposed between the active layer and source and drain electrodes; and
    a third dielectric film disposed between the source and drain electrodes and the light-emitting element, wherein
    the at least one layer of dielectric film is at least one of the first, second, and third dielectric films.

19. The display device according to claim 1, wherein the second bridge is connected to the second touch electrode via a touch contact hole.

20. The display device according to claim 1, wherein the touch buffer film is formed from at least one of a photoacryl-based, epoxy-based, Parylene-C, Parylene-N, Parylene-F, and siloxane-based organic film.

21. The display device according to claim 1, wherein each of the first and second plurality of touch electrodes has a first conductive layer and a second conductive layer that is different from the first conductive layer, the second conductive layer being directly on the first conductive layer, the first conductive layers of the plurality of touch electrodes being on and directly contacting the touch buffer film.

* * * * *